(12) United States Patent
Sun et al.

(10) Patent No.: US 11,641,739 B2
(45) Date of Patent: May 2, 2023

(54) SEMICONDUCTOR NON-VOLATILE MEMORY DEVICES

(71) Applicant: GLOBALFOUNDRIES Singapore Pte. Ltd., Singapore (SG)

(72) Inventors: Yongshun Sun, Singapore (SG); Eng Huat Toh, Singapore (SG); Shyue Seng Tan, Singapore (SG); Xinshu Cai, Singapore (SG); Lanxiang Wang, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 16/889,726

(22) Filed: Jun. 1, 2020

(65) Prior Publication Data

US 2021/0375895 A1 Dec. 2, 2021

(51) Int. Cl.
*H01L 27/11558* (2017.01)
*H01L 27/11539* (2017.01)
*H01L 29/66* (2006.01)

(52) U.S. Cl.
CPC .. *H01L 27/11558* (2013.01); *H01L 27/11539* (2013.01); *H01L 29/66181* (2013.01)

(58) Field of Classification Search
None
See application file for complete search history.

(56) References Cited

U.S. PATENT DOCUMENTS

| | | | |
|---|---|---|---|
| 4,203,158 A * | 5/1980 | Frohman-Bentchkowsky | ............ H01L 27/115 257/321 |
| 5,790,455 A * | 8/1998 | Caywood | ............ H01L 27/115 257/E27.103 |
| 6,207,989 B1 * | 3/2001 | Li | ........... H01L 27/115 257/314 |
| 7,099,192 B2 | 8/2006 | Wang et al. | |
| 8,283,751 B2 | 10/2012 | Kurjanowicz | |
| 2006/0292754 A1 * | 12/2006 | Min | ...... H01L 27/112 257/E21.666 |
| 2007/0145467 A1 * | 6/2007 | Park | ...... H01L 27/115 257/E21.422 |
| 2018/0114793 A1 * | 4/2018 | Lee | ...... H01L 29/0847 |

\* cited by examiner

*Primary Examiner* — Mohammad M Hoque
*Assistant Examiner* — Kevin Quinto
(74) *Attorney, Agent, or Firm* — David Cain

(57) ABSTRACT

A memory device is provided. The memory device includes an active region in a substrate, an electrically-isolated electrode, and a dielectric layer. The electrically-isolated electrode is disposed over the active region. The dielectric layer is disposed between the electrically-isolated electrode and the active region and has a first dielectric portion having a first thickness and a second dielectric portion having a second thickness.

12 Claims, 3 Drawing Sheets

SEMICONDUCTOR NON-VOLATILE MEMORY DEVICES

FIELD OF THE INVENTION

The disclosed subject matter relates generally to semiconductor devices, and more particularly to semiconductor non-volatile memory devices and methods of forming the same.

BACKGROUND

Memory devices are widely used in semiconductor devices and can be generally divided into volatile memory devices and non-volatile memory (NVM) devices. Volatile memory devices require a supply of electric power to retain stored information but lose the information when the supply of electric power is interrupted. NVM devices, on the other hand, retain the stored information even without a supply of electric power.

NVM devices may be operated by employing a charge retention mechanism to store information such as, but not limited to, a charge storage mechanism or a charge trapping mechanism. For example, charges may be stored in a floating gate structure during a program operation and charges may be expelled from the floating gate structure during an erase operation of an NVM device.

As the semiconductor industry continues to progress, it is desirable to provide NVM devices having optimized performance and methods of forming the same.

SUMMARY

To achieve the foregoing and other aspects of the present disclosure, non-volatile memory (NVM) devices and methods of forming the same are presented.

According to an aspect of the present disclosure, a memory device is provided. The memory device includes an active region in a substrate, an electrically-isolated electrode, and a dielectric layer. The electrically-isolated electrode is disposed over the active region. The dielectric layer is disposed between the electrically-isolated electrode and the active region and has a first dielectric portion having a first thickness and a second dielectric portion having a second thickness.

According to another aspect of the present disclosure, a memory device is provided. The memory device includes a first and a second active region in a substrate, an isolation region, a first and a second electrically-isolated electrode, and a dielectric layer. The isolation regions are disposed between the first and second active regions. The first electrically-isolated electrode is disposed over the first active region and the second electrically-isolated electrode is disposed over the second active region. The dielectric layer is disposed between the first electrically-isolated electrode and the first active region and has a first dielectric portion having a first thickness and a second dielectric portion having a second thickness.

According to yet another aspect of the present disclosure, a method of fabricating a memory device is provided. The method includes forming a first active region and a second active region in a substrate and forming a dielectric layer over the first and second active regions. The dielectric layer has a first dielectric portion of a first thickness and a second dielectric portion of a second thickness. A first electrically-isolated electrode and a second electrically-isolated electrode are formed over the first and second active regions, respectively, and the first and the second electrically-isolated electrodes are electrically coupled to define a floating gate for the memory device

BRIEF DESCRIPTION OF THE DRAWINGS

The embodiments of the present disclosure will be better understood from a reading of the following detailed description, taken in conjunction with the accompanying drawings.

Figure 1:
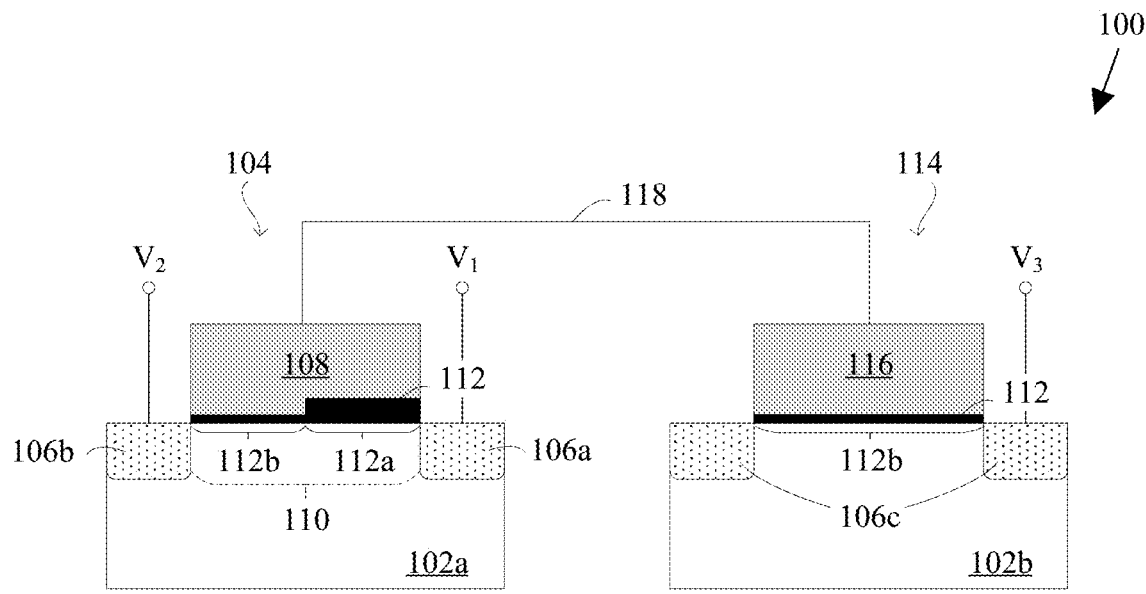
FIG. 1 is a cross-sectional view of a non-volatile memory (NVM) device, according to an embodiment of the disclosure.

For simplicity and clarity of illustration, the drawings illustrate the general manner of construction, and certain descriptions and details of well-known features and techniques may be omitted to avoid unnecessarily obscuring the discussion of the described embodiments of the device. Additionally, elements in the drawings are not necessarily drawn to scale. For example, the dimensions of some of the elements in the drawings may be exaggerated relative to other elements to help improve understanding of embodiments of the device. The same reference numerals in different drawings denote the same elements, while similar reference numerals may, but do not necessarily, denote similar elements.

DETAILED DESCRIPTION

The present disclosure relates to semiconductor non-volatile memory (NVM) devices having optimized performance and methods of forming the same. Various embodiments of the present disclosure are now described in detail with accompanying drawings. It is noted that like and corresponding elements are referred to by the use of the same reference numerals. The embodiments disclosed herein are exemplary, and not intended to be exhaustive or limiting to the disclosure.

FIG. 1 is a cross-sectional view of an NVM device 100, according to an embodiment of the disclosure. The NVM device 100 may be arranged in a memory cell region of a semiconductor device and the NVM device 100 may be part of a plurality of NVM devices arranged in an array configuration of rows and columns in the memory cell region. Only one NVM device is illustrated for clarity purposes. In an embodiment of the disclosure, the NVM device 100 may be a multi-time-programmable (MTP) NVM device or a flash memory cell having a floating gate.

The NVM device 100 may include a plurality of active regions in a substrate (not shown). The plurality of active regions may have different dopant conductivity types, such as P-type or N-type conductivity, as well as different dopant depths and different dopant concentrations. P-type conductivity dopants may include, but not limited to, boron, aluminum, or gallium. N-type conductivity dopants may include, but not limited to, arsenic, phosphorus, or antimony. The dopant concentrations and/or dopant depths in the substrate, for example, may vary depending on the technology node and design requirements for the NVM device 100.

The plurality of active regions may include a first active region 102a having a first conductivity type and a second active region 102b having a second conductivity type in a substrate (not shown). The first active region 102a may be disposed laterally adjacent to the second active region 102b. In an embodiment of the disclosure, the first active region 102a may be of P-type conductivity and the second active region 102b may be of N-type conductivity.

The NVM device 100 may include a field-effect transistor (FET) 104 formed in the first active region 102a. The FET 104 may further include a first doped region 106a, a second doped region 106b, a first electrode 108, a dielectric layer 112. The first doped region 106a and the second doped region 106b may be disposed in the first active region 102a at opposing sides of the first electrode 108, such that the first doped region 106a and the second doped region 106b define a channel 110 therebetween. In an embodiment of the disclosure, the first and second doped regions (106a and 106b, respectively) may be of N-type conductivity. In another embodiment of the disclosure, the first doped region 106a may serve as a drain region of the FET 104 and the second doped region 106b may serve as a source region of the FET 104.

The NVM device 100 may further include a capacitor 114 formed in the second active region 102b. The capacitor 114 may further include a second electrode 116 and at least one doped region 106c. The at least one doped region 106c may be disposed in the second active region 102b that is adjacent to the second electrode 116. In an embodiment of the disclosure, the at least one third doped region 106c may be of N-type conductivity.

The dielectric layer 112 may be disposed over the first and second active regions (102a and 102b, respectively). The dielectric layer 112 over the first active region 102a separates the first electrode 108 from the first active region 102a and the dielectric layer over the second active region 102b separates the second electrode 116 from the second active region 102b. In an embodiment of the disclosure, the dielectric layer 112 is formed of silicon dioxide. As will be appreciated by those skilled in the art, other suitable dielectric materials known in the art may be also applicable to the embodiments disclosed herein.

The first electrode 108 of the FET 104 and the second electrode 116 of the capacitor 114 may be electrically isolated electrodes and they may be electrically coupled together to define a floating gate 118; the electrical coupling indicated generally by a line. A floating gate is an electrically-isolated gate structure that serves as charge storage for an NVM device. The electrical coupling between the first electrode 108 and the second electrode 116 may serve to balance the two electrodes in the same potential while each of them varies in voltage levels. In an embodiment of the disclosure, the first electrode 108 and the second electrode 116 may be formed of polycrystalline silicon.

Although not shown in the accompanying drawings, isolation regions may be provided for isolating or separating the FET 104 from the capacitor 114 and the NVM device 100 from neighboring conductive features. For example, the isolation regions may include shallow trench isolation (STI) regions, deep trench isolation (DTI) regions, or the like. Additionally, it is understood that other features, such as sidewall spacers, lightly doped diffusion (LDD) regions, and silicidation may be further applied to the NVM device 100.

An NVM device may be programmed by utilizing a hot carrier injection (HCI) mechanism and may be erased by utilizing a Fowler-Nordheim (FN)-tunneling mechanism. In order to increase the performance of the NVM device during a program operation, it is desirable to increase the coupling ratio of the NVM device.

Coupling ratio is one of the factors that affect the program performance of an NVM device. The term "coupling ratio" as used herein refers to the ratio of the capacitance of the control gate $C_{CG}$ to the total capacitance $C_{TOTAL}$ of the NVM device. The $C_{TOTAL}$ of the NVM device is a summation of the capacitance between all terminals of the NVM device and the floating gate, including the capacitance between the control gate and the floating gate $C_{CG}$, between the source terminal and the floating gate $C_s$, between the drain terminal and the floating gate $C_d$, and between the substrate and the floating gate $C_b$. The coupling ratio of an NVM device affects both the operating voltage and the device operating speed. Generally, a high coupling ratio advantageously enables usage of lower operating voltage while maintaining a comparable device operating speed, thereby achieving an optimized program performance of the NVM device and improving the device margin of the NVM device. The coupling ratio of the NVM device may be increased by decreasing the capacitive coupling between the floating gate and the first active region; achievable by increasing the thickness of the dielectric layer therebetween.

However, the thicker dielectric layer potentially renders an erase operation ineffective. The electric field necessary for an effective FN-tunneling mechanism to function may not be sufficient to repel the charges from the floating gate to the active region through the thicker dielectric layer.

Therefore in order to balance the program and erase performances of using a thicker dielectric layer, the dielectric layer 112 may have different thicknesses. As illustrated in FIG. 1, the dielectric layer 112 has a first dielectric portion 112a having a first dielectric thickness and a second dielectric portion 112b having a second dielectric thickness. In an embodiment of the disclosure, the second portion of the dielectric layer 112b is thinner than that of the first portion of the dielectric layer 112a. In another embodiment of the disclosure, the dielectric layer 112 of the FET 104 has the second portion of the dielectric layer 112b may be arranged adjacent to the second doped region 106b. In yet another embodiment of the disclosure, the dielectric layer 112 of the capacitor 114 has the second portion of the dielectric layer 112b arranged between the second electrode 116 and the second active region 102b.

The dielectric layer 112, having different dielectric thicknesses, advantageously optimizes the program and erase performances of the NVM device 100. The first portion of the dielectric layer 112a, being relatively thicker, reduces the capacitive coupling of the first electrode 108 to the first active region 102a, thereby increasing the coupling ratio of the FET 104 and achieving an optimized program operation performance. Additionally, the second portion of the dielectric layer 112b, being relatively thinner, maintains the effectiveness of an erase operation.

Although it is illustrated in FIG. 1 that the first and second portions of the dielectric layer (112a and 112b, respectively) as having substantially similar lengths at the first active region 102a, it is understood that the lengths of the first and second portions of the dielectric layer (112a and 112b, respectively) may not be the same at the first active region 102a. In an embodiment of the disclosure, it is preferably that the length of the first portion of the dielectric layer 112a is longer than that of the second dielectric portion 112b at the first active region 102a. Having a greater proportion of a thicker dielectric layer advantageously lowers the capacitive coupling of the NVM device 100 to substrate and drain even further, thereby further improving the coupling ratio of the NVM device 100.

In an embodiment of the disclosure, the first portion of the dielectric layer 112a has a dielectric thickness of approximately 250 Å. In another embodiment of the disclosure, the second portion 112b of the dielectric layer has a dielectric thickness of at least 80 Å. In yet another embodiment, the first portion of the dielectric layer 112a may have a dielectric thickness of no more than three times the thickness of the second dielectric portion 112b.

As illustrated in FIG. 1, a plurality of terminals may be connected to the NVM device 100. In an embodiment of the disclosure, a first operating voltage $V_1$ may be supplied to a first terminal to bias the first doped region 106a, a second operating voltage $V_2$ may be supplied to a second terminal to bias the second doped region 106b, and a third operating voltage $V_3$ may be supplied to a third terminal to bias the third doped region 106c. The third terminal may electrically couple the second active region 102b to capacitively bias the second electrode 116. In an embodiment of the disclosure, the third operating voltage $V_3$ may be supplied by a control gate of the NVM device 100.

The first, second, and third operating voltages may be provided by on-chip or external circuitry, or a combination thereof, as will be appreciated by those skilled in the art.

Figure 2:
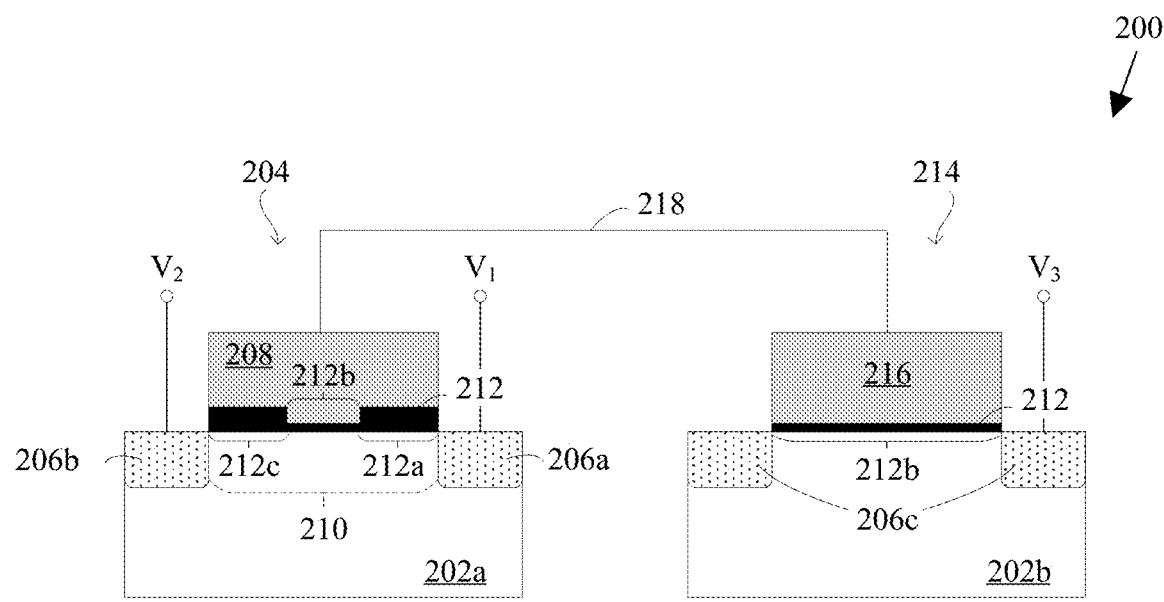
FIG. 2 is a cross-sectional view of a non-volatile memory (NVM) device, according to another embodiment of the disclosure.

FIG. 2 is a cross-sectional view of an NVM device 200, according to another embodiment of the disclosure. The NVM device 200 may be arranged in a memory cell region of a semiconductor device and the NVM device 200 may be part of a plurality of NVM devices arranged in an array configuration of rows and columns in the memory cell region. Only one NVM device is illustrated for clarity purposes. In an embodiment of the disclosure, the NVM device 200 may be a multi-time-programmable (MTP) NVM device or a flash memory cell having a floating gate.

Similarly to the embodiment of NVM device 100 in FIG. 1, the NVM device 200 may include a FET 204 and a capacitor 214 arranged over a first active region 202a and a second active region 202b, respectively.

The FET 204 may include a first electrode 208, a first doped region 206a, a second doped region 206b, and a dielectric layer 212; the dielectric layer 212 separates the first electrode 208 from the first active region 202a. The first doped region 206a and the second doped region 206b are spaced apart defining a channel 210 therebetween and are disposed at opposite sides of the first electrode 208.

The capacitor 214 may include a second electrode 216, at least one third doped region 206c, and the dielectric layer 212 separating the second electrode 216 from the second active region 202b. The first electrode 208 of the FET 204 may be electrically coupled to the second electrode 216 of the capacitor 214 to define a floating gate 218; the electrical coupling indicated generally by a line.

The dielectric layer 212 of the FET 204 may also have different thicknesses, similar to the dielectric layer 112 in the embodiment of NVM 100 in FIG. 1. The dielectric layer 212 may have a first dielectric portion 212a having a first thickness, a second dielectric portion 212b having a second thickness, and a third dielectric portion 212c having a third thickness, such that the second dielectric portion 212b may be disposed between the first and third portions of the dielectric layer (212a and 212c, respectively). In an embodiment of the disclosure, the third thickness may be substantially equal to the first thickness. In other embodiments of the disclosure the third thickness may be a different thickness from the first and second thicknesses.

In this embodiment of the disclosure, the first and third portions of the dielectric layer (212a and 212c, respectively) decrease the capacitive coupling of the first electrode 208 to the first active region 202a for an optimized program operation of the NVM device 200 using HCI mechanism. The second portion of the dielectric layer 212b, being relatively thinner, advantageously provides an effective erase operation of the NVM device using the FN-tunneling mechanism.

Figure 3A:
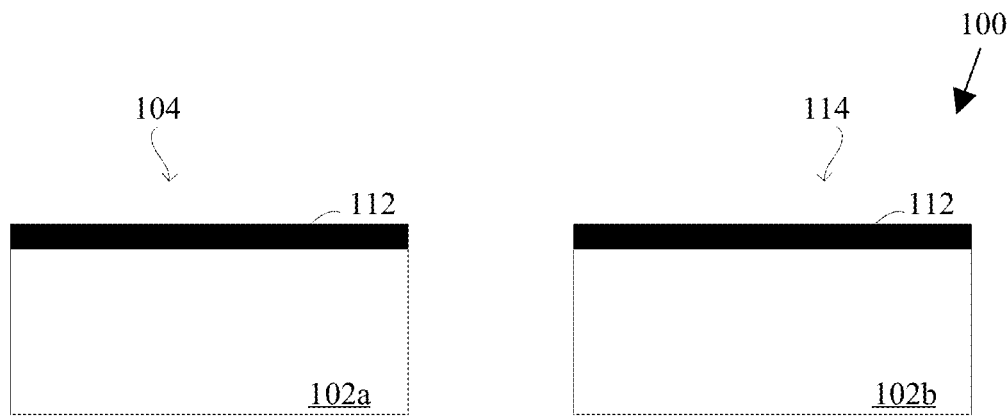
FIGS. 3A to 3D are cross-sectional views of a non-volatile memory (NVM) device, illustrating various stages of forming the NVM device, according to embodiments of the disclosure.
Figure 3B:
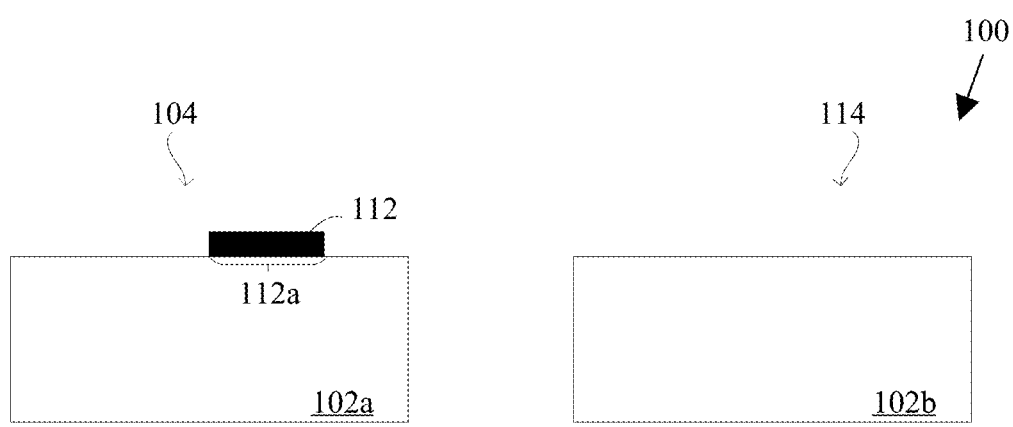
Figure 3C:
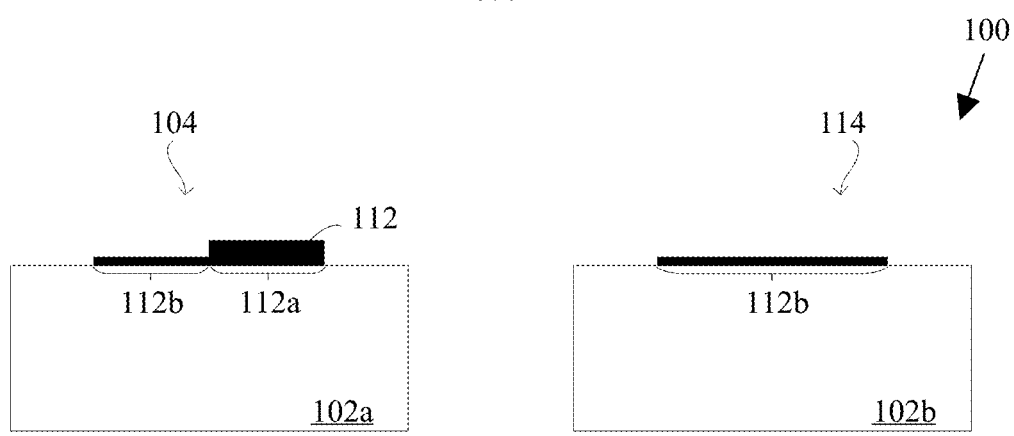

FIGS. 3A to 3C are cross-sectional views of the NVM device 100, illustrating a method of forming the NVM device 100, according to embodiments of the disclosure. Certain structures may be conventionally fabricated, for example, using known processes and techniques, and specifically disclosed processes and methods may be used to achieve individual aspects of the present disclosure.

As illustrated in FIG. 3A, a first active region 102a and a second active region 102b may be provided in a substrate (not shown). The first and second active regions (102a and 102b, respectively) may be regions defined to form a FET 104 and a capacitor 114, respectively, for the NVM device 100. The first active region 102a and the second active region 102b may be formed by introducing dopants into the substrate.

A dielectric layer 112 may be deposited over the first and second active regions (102a and 102b, respectively). The dielectric layer 112 may be deposited using various deposition techniques such as, but not limited to, chemical vapor deposition (CVD) or plasma-enhanced CVD. In an embodiment of the disclosure, the dielectric layer 112 may be deposited to a thickness of approximately 250 Å.

FIG. 3B illustrates the NVM device 100 after patterning the dielectric layer 112, according to an embodiment of the disclosure. The dielectric layer 112 may be patterned using various patterning techniques such that portions of the dielectric layer 112 may be removed, leaving a first portion of the dielectric layer 112a over the first active region 102a.

As used herein, "patterning techniques" include deposition of patterning material or photoresist, patterning, exposure, development, etching, cleaning, and/or removal of the patterning material or photoresist as required in forming a described pattern, structure or opening. Exemplary examples of techniques for patterning include, but not limited to, wet etch lithographic processes, dry etch lithographic processes, or direct patterning processes. Such techniques may use mask sets and/or mask layers.

The deposition of the dielectric layer and the patterning of the first portion of the dielectric layer 112a, as described above in FIGS. 3A and 3B, may be performed concurrently with other active devices, such as transistors in other regions of the semiconductor device, having similar dielectric thicknesses. No additional patterning mask or layer is required to specifically pattern the first portion of the dielectric layer 112a.

FIG. 3C illustrates the NVM device 100 after forming a second portion of the dielectric layer 112b, according to an embodiment of the disclosure. A layer of dielectric material may be deposited to form the second portion of the dielectric layer 112b. The second portion of the dielectric layer 112b may be deposited over the first active region 102a adjacent to the first portion of the dielectric layer 112a and the second active region 102b. The second portion of the dielectric layer 112b may share a patterning mask or layer with other active devices having similar dielectric thicknesses, such as transistors, in other regions of the semiconductor device and may be fabricated concurrently with those active devices.

In an embodiment of the disclosure, the first portion of the dielectric layer 112a, among other regions, may be protected with a layer of material, such as a patterning layer or a photoresist layer, such that the second layer of dielectric material may not be deposited over the first portion of the dielectric layer 112a. The first and second portions of the dielectric layer (112a and 112b, respectively) form the dielectric layer 112 the NVM device 100.

The second portion of the dielectric layer 112b may be deposited to a thickness that is thinner than the first dielectric portion 112a. In an embodiment of the disclosure, the second portion of the dielectric layer 112b may be deposited to a thickness of about 80 Å. In another embodiment, the second portion of the dielectric layer 112b may be deposited to a thickness of no less than one-third of that of the first portion 112a. In an embodiment of the disclosure, the dielectric layer 112 includes silicon dioxide.

Figure 3D:
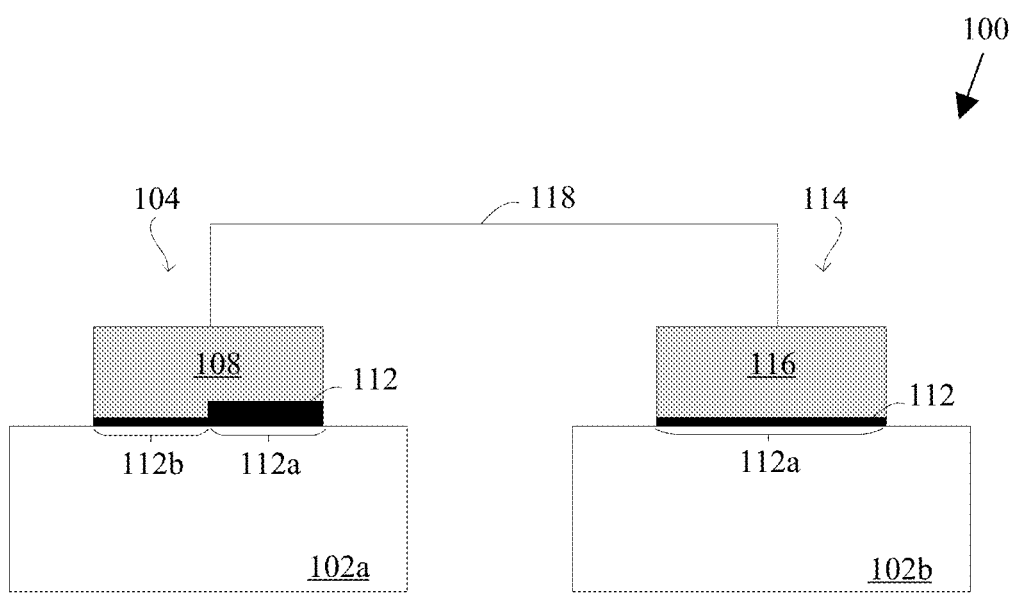

FIG. 3D illustrates the NVM device 100 after forming a first electrode 108 and a second electrode 116, according to an embodiment of the disclosure. A layer of conductive material may be deposited over the first active region 102a and the second active region 102b, covering the dielectric layer 112. The layer of conductive material may be patterned using various patterning techniques to form the first electrode 108 over the first active region 102a and the second electrode 116 over the second active region 102b. The first electrode 108 in the first active region 102a and the second electrode 116 in the second active region 102b may be coupled together to define a floating gate 118; the electrical coupling indicated generally by a line. In an embodiment of the disclosure, the layer of conductive material may include polycrystalline silicon.

The NVM device 100 may undergo further fabrication steps to form a FET 104 and a capacitor 114. A plurality of doped regions, similar to the embodiment NVM device 100 illustrated in FIG. 1, may be fabricated. A first doped region 106a and a second doped region 106b may be disposed at opposite sides of the first electrode 108 forming a channel 110 therebetween the first and second doped regions (106a and 106b, respectively). At least one third doped region 106c may be disposed adjacent to the second electrode 116

It is understood that other fabrication steps such as, but not limited to, forming contact structures, depositing interlayer dielectric layers, and forming interconnect structures may be further performed to the NVM device 100.

As presented above, various embodiments of an NVM device having different thicknesses of a dielectric layer have been described. The NVM device may be arranged in a memory cell region of a semiconductor device and the NVM device may be part of a plurality of NVM devices arranged in an array configuration of rows and columns in the memory cell region.

The dielectric layer, having different dielectric thicknesses, advantageously optimized the performance of the NVM device 100. The thicker portion of the dielectric layer improves the coupling ratio of the NVM device for an optimized program operation using the HCI mechanism, while the thinner portion of the dielectric layer enables an effective erase operation using FN-tunneling mechanism. The dielectric thicknesses may be adjusted accordingly to achieve the desired performance of an NVM device.

The NVM device may be operated by applying appropriate operating voltages. Memory access operations may include a program operation, an erase operation, or a read operation. As the floating gate is inherently an electrically isolated gate structure, the voltage may be supplied to the floating gate through a capacitively-coupled control gate.

Table 1 below shows a set of exemplary voltages that may be supplied to an NVM device for the different memory access operations. It is understood that other suitable types of voltage values may be supplied, depending on the design and technology node of the NVM device. Programming and erasing NVM devices have known techniques in the art.

|  | Drain Region ($V_1$) | Source Region ($V_2$) | Control Gate ($V_3$) | Substrate |
|---|---|---|---|---|
| Program Operation | 4 V | ~9 V | ~9 V | 0 V |
| Erase Operation | 0 V | ~9 V | 0 V | 0 V |
| Read Operation | 1.2 V | 0 V | ~1 V to 3.5 V | 0 V |

The terms "top", "bottom", "over", "under", and the like in the description and in the claims, if any, are used for descriptive purposes and not necessarily for describing permanent relative positions. It is to be understood that the terms so used are interchangeable under appropriate circumstances such that the embodiments of the devices described herein are, for example, capable of operation in other orientations than those illustrated or otherwise described herein.

Additionally, the formation of a first feature over or on a second feature in the description that follows may include embodiments in which the first and second features are formed in direct contact, and may also include embodiments in which additional features may be formed interposing the first and second features, such that the first and second features may not be in direct contact.

Similarly, if a method is described herein as involving a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device. Occurrences of the phrase "in an embodiment" herein do not necessarily all refer to the same embodiment.

In addition, unless otherwise indicated, all numbers expressing quantities, ratios, and numerical properties of materials, reaction conditions, and so forth used in the specification and claims are to be understood as being modified in all instances by the term "about".

While several exemplary embodiments have been presented in the above detailed description of the device, it should be appreciated that a number of variations exist. It should further be appreciated that the embodiments are only examples, and are not intended to limit the scope, applicability, dimensions, or configuration of the device in any way. Rather, the above detailed description will provide those skilled in the art with a convenient road map for implementing an exemplary embodiment of the device, it being understood that various changes may be made in the function and arrangement of elements and method of fabrication described in an exemplary embodiment without departing from the scope of this disclosure as set forth in the appended claims.

What is claimed is:
1. A memory device comprising:
a substrate having a first active region and a second active region laterally spaced from the first active region;
an isolation region between the first active region and the second active region;

a first electrically-isolated electrode over the first active region, wherein the first electrically-isolated electrode has a first portion of a first electrode thickness and a second portion of a second electrode thickness that is greater than the first electrode thickness, and the first portion and the second portion have substantially coplanar upper surfaces;

a second electrically-isolated electrode over the second active region, wherein the second electrically-isolated electrode has an electrode thickness equal to the second electrode thickness of the first electrically-isolated electrode and forms a floating gate with the first electrically-isolated electrode for the memory device; and a dielectric layer directly under the first electrically-isolated electrode and the second electrically-isolated electrode, wherein the dielectric layer has a first dielectric portion having a first dielectric thickness directly under the first portion of the first electrically-isolated electrode and a second dielectric portion having a second dielectric thickness directly under the second portion of the first electrically-isolated electrode and the second electrically-isolated electrode, the second dielectric thickness is thinner than the first dielectric thickness.

2. The memory device of claim 1, wherein the second active region, the second dielectric portion of the dielectric layer, and the second electrically-isolated electrode form a capacitor for the memory device.

3. The memory device of claim 1, wherein the second active region capacitively couples to the second electrically-isolated electrode.

4. The memory device of claim 1, further comprising a control gate, and the first electrically-isolated electrode is capacitively coupled to the control gate.

5. The memory device of claim 1, further comprising:
a plurality of doped regions, the plurality of doped regions comprises a first doped region and a second doped region in the first active region, the first doped region and the second doped region are at opposite sides of the first electrically-isolated electrode.

6. The memory device of claim 5, wherein the plurality of doped regions further comprises a third doped region in the second active region adjacent to the second electrically-isolated electrode, wherein the third doped region capacitively biases the second electrically-isolated electrode.

7. The memory device of claim 6, wherein the second electrically-isolated electrode is at a same potential as the first electrically-isolated electrode.

8. The memory device of claim 1, wherein the dielectric layer further comprises a third dielectric portion having a third dielectric thickness, the third dielectric portion is disposed under the first electrically-isolated electrode.

9. The memory device of claim 8, wherein the second dielectric portion is disposed between the first dielectric portion and the third dielectric portion of the dielectric layer.

10. The memory device of claim 8, wherein the third dielectric thickness of the third dielectric portion is equal to the first dielectric thickness of the first dielectric portion.

11. The memory device of claim 8, wherein the first electrically-isolated electrode further comprises a third portion having a third electrode thickness, the third portion of the first electrically-isolated electrode is disposed over the third dielectric portion of the dielectric layer.

12. The memory device of claim 11, wherein the third portion of the first electrically-isolated electrode has a substantially coplanar upper surface with the first portion and the second portion of the first electrically-isolated electrode.

* * * * *